United States Patent
Borseth

(10) Patent No.: US 6,340,997 B1
(45) Date of Patent: Jan. 22, 2002

(54) WORLDWIDE TELEVISION TUNING SYSTEM WITH OBJECT-BASED TUNING CONTROL MODULES

(75) Inventor: Jay Alan Borseth, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/057,785

(22) Filed: Apr. 8, 1998

(51) Int. Cl.[7] .............................. H04N 3/27; H04N 5/46; H04N 5/50

(52) U.S. Cl. ....................... 348/731; 348/732; 348/733; 348/554; 348/558; 348/725; 725/131; 725/132; 725/139; 725/140

(58) Field of Search ................................. 348/731, 732, 348/733, 726, 725, 554, 555, 558, 729; 455/161.2; 725/131, 132, 139, 140, 151, 152; H04N 5/50, 5/44, 5/46, 3/27

(56) References Cited

U.S. PATENT DOCUMENTS

| | | | | |
|---|---|---|---|---|
| 5,003,591 A | * | 3/1991 | Kauffman et al. | 380/10 |
| 5,355,162 A | * | 10/1994 | Yazolino et al. | 348/11 |
| 5,712,689 A | * | 1/1998 | Yasuki et al. | 348/561 |
| 5,732,338 A | * | 3/1998 | Schwob | 455/158.5 |
| 5,815,689 A | * | 9/1998 | Shaw et al. | 395/551 |
| 5,838,383 A | * | 11/1998 | Chimoto et al. | 348/553 |
| 5,969,770 A | * | 10/1999 | Horton | 348/569 |
| 6,005,937 A | * | 12/1999 | Lee | 380/10 |
| 6,011,546 A | * | 1/2000 | Bertram | 345/327 |
| 6,031,577 A | * | 2/2000 | Ozkan et al. | 348/465 |
| 6,038,625 A | * | 3/2000 | Ogino et al. | 710/104 |
| 6,075,568 A | * | 6/2000 | Matsuura | 348/478 |
| 6,115,080 A | * | 9/2000 | Reitmeier | 348/731 |
| 6,118,498 A | * | 9/2000 | Reitmeier | 348/725 |
| 6,209,041 B1 | * | 3/2001 | Shaw et al. | 709/321 |

* cited by examiner

Primary Examiner—Reinhard J. Eisenzopf
Assistant Examiner—Paulos M. Natnael
(74) Attorney, Agent, or Firm—Lee & Hayes, PLLC

(57) ABSTRACT

A worldwide television tuning system is configurable to the television standards and channel frequencies of multiple different countries based on a country's ITU long-distance country code. The television tuning system is architected in parallel hardware and software components. The hardware components include tuner circuitry to tune to various television frequencies carrying television video signals and video decoder circuitry coupled to receive a television video signal from the tuner circuitry and to convert the television video signal to digital video data. The software components include a tuner module coupled to adjust the tuner circuitry to a particular television frequency and a video decoder module to decode the digital video data according to a particular video standard. A driver interface layer interfaces the software layer and the hardware circuitry. When a new channel is requested, the tuner module generates and sends a beginning tuning packet to inform the video decoder module of an impending change to the new channel. In addition to the video decoder module, this tuning packet also propagates to all downstream modules (e.g., audio decoder module, VBI decoders, etc.). The tuner module then controls the tuner circuitry to tune to a new television frequency that corresponds to the new channel. Afterward, the tuner module generates and sends an ending tuning packet to inform the video decoder module that the channel change is complete. The tuning packet includes a designation of country within which the tuning system is configured to receive television signals, a channel to be tuned, the particular video standard, and flags indicating whether the tuning packet represents a beginning of a tuning operation or an ending of the tuning operation.

40 Claims, 7 Drawing Sheets

WORLDWIDE TELEVISION TUNING SYSTEM WITH OBJECT-BASED TUNING CONTROL MODULES

TECHNICAL FIELD

This invention relates to tuning systems for broadcast television signals. More particularly, this invention relates to worldwide tuning systems that are configurable to various broadcast television standards and channel frequencies used throughout the world.

BACKGROUND

Analog video standards for broadcast television differ from country to country. The broadcast television standard used here in the United States, for example, is different than the broadcast standard used in France. Conventional standards include multiple versions of NTSC (National Television Standards Committee), multiple versions of PAL (Phase Alternate Line), and multiple versions of SECAM (Sequential Couleur Avec Memoire).

Broadcast frequencies also change from country to country. Each country is assigned a range of frequencies to allot to its domestic television broadcast service. An international governing body known as the "International Telecommunications Union" or "ITU" governs the allocation of broadcast frequencies among the various countries.

The country-by-country discrepancies among broadcast standards and channel frequencies pose a problem for television manufacturers. Since each country employs a particular standard and operates within a particular range of frequencies, manufacturers must tailor their televisions to the country into which they are to be sold. Traditionally, the manufacturers have hardwired the televisions during manufacturing to comply with the standard and frequency requirements of the destination country.

FIG. 1 shows the hardware components of a broadcast television 20. It includes a tuner 22, a crossbar 24, a video decoder 26, a display 28, and speaker(s) 30. The tuner 22 tunes to a particular channel frequency to receive a broadcast television signal, which carries both video and audio data. The tuner 22 separates an analog video signal from an analog audio signal. The crossbar 24 routes the analog video signal to the video decoder 26, which converts the analog video signal to digital video data used to drive the display 28. The crossbar 24 also routes the analog audio signal to the speaker(s) or other audio components 30. It is noted that FIG. 1 represents a more modern television, which has digital capabilities. In older televisions, the crossbar 24 routes the analog video signal directly to the display 28 for depiction.

Under conventional manufacturing techniques, televisions used in different countries have different tuners 22 and video decoders 26. Televisions shipped in the United States are equipped with tuners and video decoders compatible with the U.S. broadcast standards and frequencies, whereas televisions shipped to other countries are equipped with different tuners and video decoders that are compatible with their broadcast standards and frequencies.

Country-based customization is inefficient because the manufacturer must make several versions of a product. In addition to broadcast standards and frequencies, the manufacturer might also have to contend with other regional differences, such specialized audio decoders for a particular market, or variations in picture tubes (e.g., 525 v. 625 line operation). The customization plays havoc with inventories because an overabundance of televisions for one country may not be cross-sold into another country where demand is strong.

To partially address this problem, manufacturers began using tuners and decoders that support multiple standards and frequencies. With this improvement, manufacturers are able to mass-produce one version of the television using the same components regardless of the destination country. Prior to shipping, the manufacturers program the tuner and decoder at the factory to a desired television standard and frequency range for the destination country.

While this is an improvement, it is not ideal. Video standards employed within a country may change. A country might decide to reallocate the broadcast frequencies, or perhaps adopt a different television standard, for political, administrative, or technical reasons. Televisions programmed at the factory are not capable of accommodating these changes. Accordingly, there is a need to design a television tuning system that may be upgraded in the field.

Another problem concerns portability. In the past, televisions sold into one country would typically reside in that country for the life of the product. It was less common for people to transport their televisions to different countries, unless they were permanently moving.

Today, as television tuner hardware decreases in size and continues to fall in component cost, it can be incorporated into portable computing devices, such as laptop computers. Given the portable nature of these computing devices, it is very likely that they will be used in numerous different locations throughout the world that employ different television standards and channel frequencies. Thus, there is a need for a worldwide television tuning system that is reconfigurable in the field to adapt to different television standards and channel frequencies.

SUMMARY

This invention concerns a worldwide tuning system that may be implemented in televisions, computing devices, or other television broadcast receiving units. The worldwide tuning system is configurable to the television standards and channel frequencies of multiple different countries, and is reconfigurable in the event any of these parameters change. As a result, the worldwide tuning system may be transported to different countries and reconfigured to local television broadcasts. Additionally, the worldwide tuning system is upgradable in the field to accommodate any changes in television standards and channel frequencies used in various countries.

The worldwide tuning system is configurable based on a country's ITU long-distance country code. The tuning system maintains a country code table listing a plurality of countries according to their ITU codes. For instance, the United States has an ITU code of 1 and France has an ITU code of 33. The tuning system also maintains multiple channel-to-frequency mapping tables that provide television standards and correlate channel numbers to corresponding frequencies for associated countries in the country table. The country table indexes the channel-to- frequency mapping tables.

During configuration, a user or application selects a particular country by passing in the ITU code. The tuning system uses the ITU code to locate an entry for that country in the country code table. The table entry contains an index to an associated channel-to-frequency mapping table for the selected country. The tuning system then loads and saves the channel-to-frequency mapping table for subsequent use until a new and different ITU code is passed in. The tuning system utilizes the television standard listed in the channel-to-frequency mapping table for decoding broadcast television signals in the selected country.

During tuning, the user or application enters a particular channel number. The tuning system uses the channel number to lookup a corresponding television frequency in the channel-to-frequency table. The tuning system then tunes to the television frequency.

In one implementation, the television tuning system is configured in a hardware/software architecture with parallel hardware and software components. The hardware components include tuner circuitry to tune to various television frequencies carrying television video signals and video decoder circuitry coupled to receive a television video signal from the tuner circuitry and to convert the television video signal to digital video data. Audio decoder circuitry may also be incorporated to decode the audio portion of the television signal.

The software components include a tuner module coupled to adjust the tuner circuitry to a particular television frequency and a video decoder module to decode the digital video data according to a particular video standard. The software layer also includes an audio module for controlling the audio decoder circuitry and one or more VBI (vertical blanking interval) modules for processing VBI data contained in the television signal. A driver interface layer interfaces the software layer and the hardware circuitry.

When a new channel is requested, the tuner module generates and sends a beginning tuning packet to inform the video decoder module and other downstream modules of an impending change to the new channel. The tuner module then controls the tuner circuitry to tune to a new television frequency that corresponds to the new channel. Afterward, the tuner module generates and sends an ending tuning packet to inform the video decoder module and other downstream modules that the channel change is complete. The tuning packet includes a designation of country within which the tuning system is configured to receive television signals, a channel to be tuned, the particular video standard, and flags indicating whether the tuning packet represents a beginning of a tuning operation or an ending of the tuning operation.

In the interim between the beginning and ending tuning packets, some of the modules may temporarily cease processing the television signal to avoid processing contaminated or incomplete data resulting from the channel change operation. For instance, the audio module might mute the audio playback and the VBI modules might stop processing the VBI data while the channel is being changed.

BRIEF DESCRIPTION OF THE APPENDIX

An attached appendix forms part of this document. The appendix contains a description of methods implemented in a tuner API (application program interface) utilized by the worldwide tuning system.

DETAILED DESCRIPTION

This invention concerns a worldwide tuning system that is configurable to different broadcast television standards and channel frequencies used by various countries according to the countries' ITU long-distance country code. The worldwide tuning system may be implemented in televisions, computing devices, or other television broadcast receiving units. One example context for implementing the worldwide tuning system is described below.

Broadcast System

Figure 1:
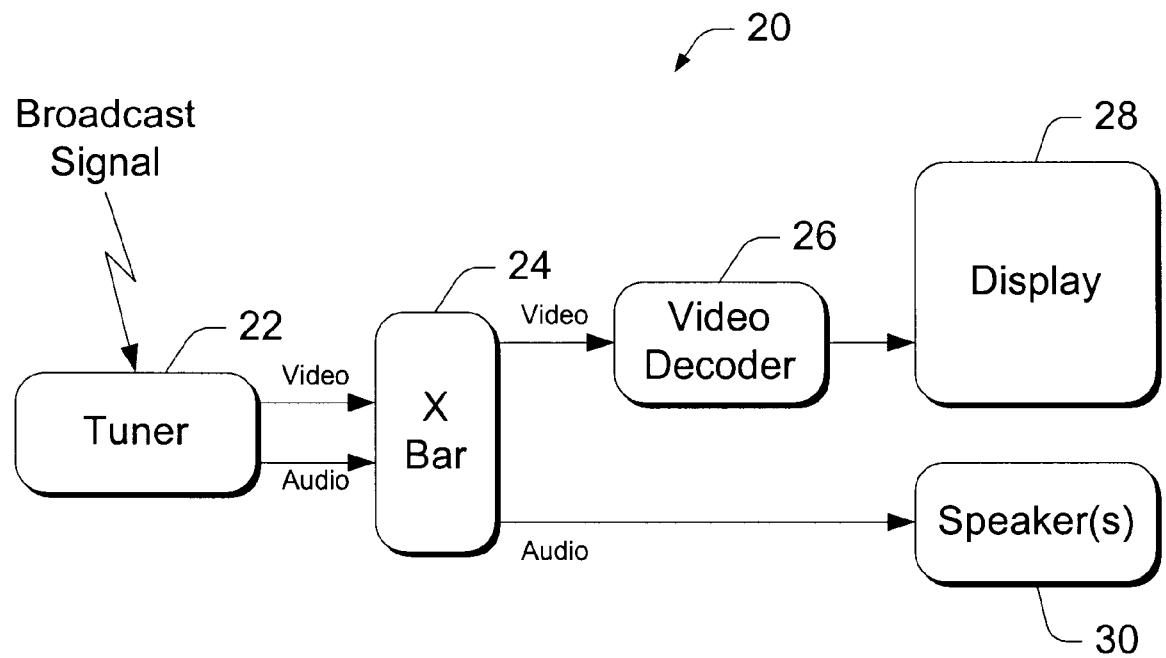
FIG. 1 is a block diagram of a prior art television tuner.
Figure 2:
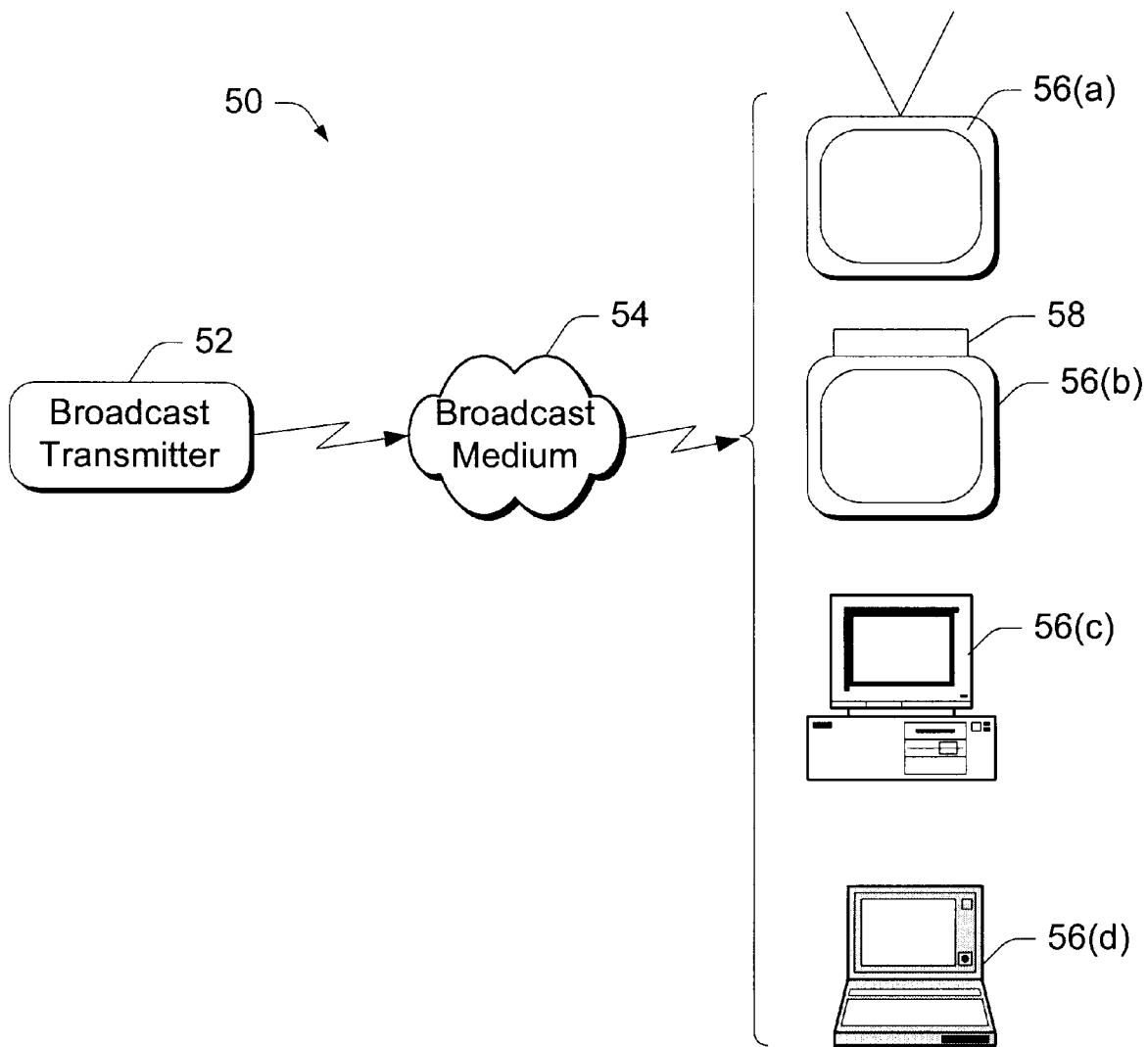
FIG. 2 is a diagrammatic illustration of a broadcast television system.

FIG. 2 shows a broadcast system 50 having a broadcast transmitter 52 that broadcasts video and audio signals over a broadcast medium 54 to broadcast-enabled viewer units 56(a)–56(d). The broadcast medium 54 is representative of different types of distribution technologies, such as satellite, RF, cable, and the Internet. The broadcast transmitter 52 is representative of different technologies that are appropriate for the distribution medium, such as a satellite transmitter, RF transmitter, microwave transmitter, cable head end, and video server.

Three different broadcast-enabled viewer units are shown in FIG. 2. Viewer unit 56(a) is a wireless television that receives broadcast signals over a wireless medium, such as satellite or RF networks. Viewer unit 56(b) is a cable-enabled television having a set-top box 58 for receiving video broadcast over a cable network. Viewer unit 56(c) is a broadcast-enabled personal computer (PC) that is capable of receiving a broadcast video stream from the broadcast medium (e.g., satellite, Internet, cable, etc.) and playing the video on a computer monitor or other display device. One example implementation of a broadcast-enabled PC is described in a co-pending U.S. patent application Ser. No. 08/503,055, entitled "Broadcast-Enabled Personal Computer," filed Jan. 29, 1996 in the names of Gabe L. Newell, Dan Newell, Steven J. Fluegel, David S. Byrne, Whitney McCleary, James O. Robarts, Brian K. Moran; William B. McCormick, T. K. Backman, Kenneth J. Birdwell, Joseph S. Robinson, Alonzo Gariepy, Marc W. Whitman, and Larry Brader. This application is assigned to Microsoft Corporation, and is incorporated herein by reference. Viewer unit 56(d) is a portable computer that is equipped with a broadcast tuner to receive broadcast signals.

Each viewer unit 56 is equipped with a worldwide tuning system that tunes to a particular broadcast frequency to receive video and audio signals and processes the signals according to a particular broadcast standard for output to a display and sound subsystem. The worldwide tuning system flexibly adapts to various broadcast standards and broadcast frequencies of different countries around the world. As a result, a manufacturer can produce just one version of a viewer unit that can be used anywhere in the world. Once the viewer unit resides in a particular country, the worldwide tuning system unit can be configured to the standards and frequencies of that county.

Figure 3:
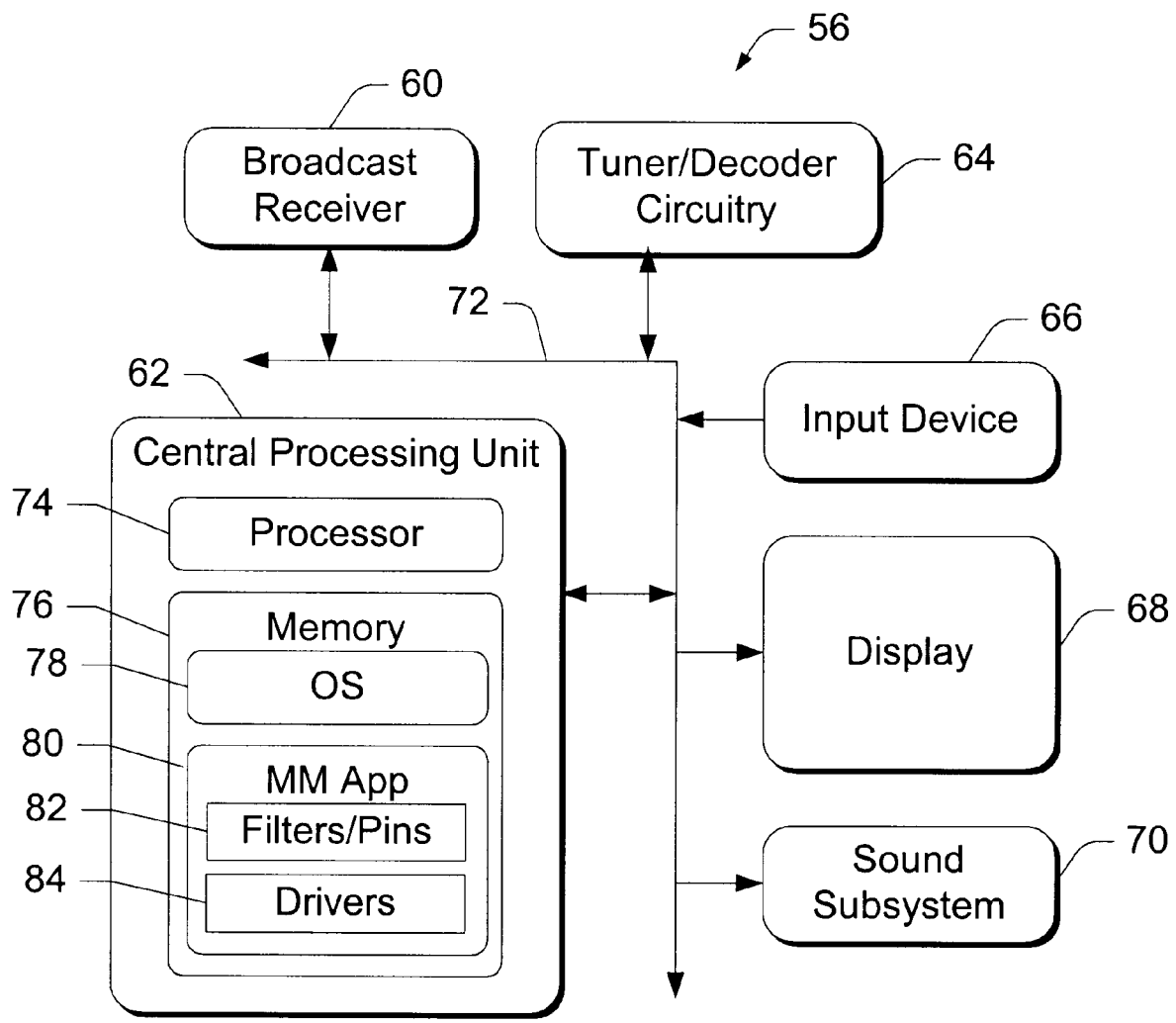
FIG. 3 is a block diagram of a broadcast-enabled viewer unit configured for TV reception.

FIG. 3 shows an exemplary implementation of a viewer unit 56. It includes a broadcast receiver 60 (e.g., RF antenna, satellite dish, cable box, network card, etc.), a central processing unit 62, tuner/decoder circuitry 64, an input device 66 (e.g., keyboard, mouse, remote control, etc.), a display 68 (e.g., television, VGA monitor, etc.), and a sound subsystem 70. These components are coupled via a busing structure 72 that includes, for example, parallel and serial communications interfaces. The tuner/decoder circuitry 64 tunes the broadcast receiver 60 to the appropriate frequency and decodes incoming analog signals. It is noted that the tuner/decoder circuitry 64 may be implemented as a chipset within the central processing unit 62.

The central processing unit 62 has a processor 74 and memory 76 (e.g., RAM, ROM, Flash, disk drive, floppy disk drive, CD-ROM, etc.). An operating system 78 is stored in memory 76 and executed on processor 74 when the viewer unit is turned on. The operating system 78 is preferably a multitasking operating system that allows simultaneous execution of multiple applications. One preferred operating system is a Windows brand operating system sold by Microsoft Corporation, such as Windows CE, or Windows 95, or Windows NT or other derivative versions of Windows.

The viewer unit 56 runs a multimedia application 80 that provides processing support of the streaming video and analog signals received over the broadcast receiver. The multimedia application 80 is stored in memory 74 and executed on the processor 72. In the illustrated implementation, the multimedia application 80 is implemented using a technology known as Microsoft DirectShow, which provides playback multimedia streams from local files or Internet servers, and capture of multimedia streams from devices.

The multimedia application includes a modular arrangement of pluggable components known as "filters" which are connected together at interface points known as "pins" (referenced generally as number 82 in FIG. 3). A filter is a COM (component object model) object that performs a specific task on a data stream, such as decompressing video data. For each stream, the filter exposes at least one pin. A pin is a COM object created by the filter that represents a point of connection for a unidirectional data stream on the filter. Input pins accept data into the filter, and output pins provide data to other filters. A typical transform filter has one input pin and one output pin. A source filter has one output pin for each data stream and a destination filter has one input pin. More complex filter arrangements are also possible.

Filters are arranged in a configuration called a "filter graph". During construction, a developer uses a component called the "filter graph manager" to connect the filters and control the stream's data flow.

Here, the filters 82 of the multimedia application 80 are configured to control underlying hardware elements in the tuner/decoder circuitry 64 associated with reception and playback of a broadcast signal. The multimedia application 80 also has a layer of drivers 84 that interface the filters 82 with the tuner/decoder circuitry 64.

Worldwide Tuning System

Figure 4:
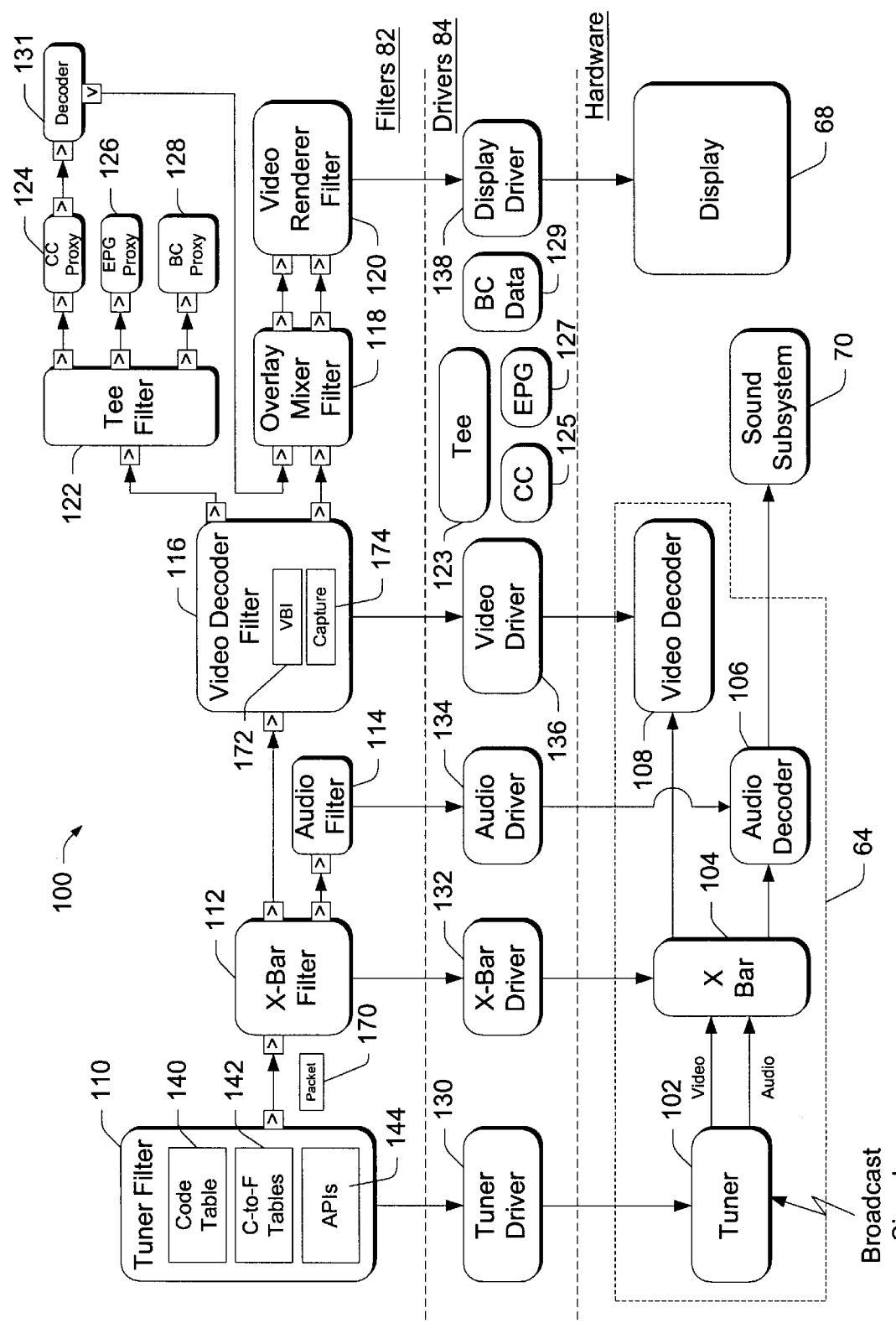
FIG. 4 is a block diagram of a worldwide tuning system implemented in the viewer unit of FIG. 3.

FIG. 4 shows a hardware/software architecture of a worldwide tuning system 100. The architecture has three layers: a software layer of filters 82, a software layer of drivers 84, and a hardware layer comprising the tuner/decoder circuitry 64. The tuner/decoder circuitry 64 has a tuner 102 that receives an analog broadcast signal at a particular broadcast frequency. The tuner is capable of tuning to a wide range of frequencies allotted to different countries.

The tuner 102 separates the broadcast signal into two analog data signals: a video signal and an audio signal. The audio and video signals are routed through crossbar 104 to an audio decoder 106 and a video decoder 108, respectively.

In this implementation, the audio decoder 106 converts the analog signal to digital audio data, which is passed to the sound subsystem 70 for further processing to provide such qualities as surround sound. In another implementation, the audio decoder passes the analog signal through without digitizing it. In this case, the audio decoder is used to control other parameters, such as volume.

The video decoder 108 converts the analog video signal to digital video data. The video decoder 108 is preferably a multistandard analog decoder that is capable of decoding video signals using one of a variety of video standards. The digital video data is stored in the memory 76 of the central processing unit 62 (FIG. 3), which is accessible by the filters 82 for processing the video data prior to display.

The worldwide tuning system 100 implements a filter graph 82 that programs the hardware tuner/decoder circuitry 64 to the appropriate frequencies and standards used in various countries of the world. The filter graph 82 includes a tuner filter 110, a crossbar filter 112, an audio filter 114, and a video decoder filter 116. These filters correspond to respective hardware components in the tuner/decoder circuitry 64, and namely the tuner 102, crossbar 104, audio decoder 106, and video decoder 108. Other filters in graph 82 include an overlay mixer filter 118, a video renderer filter 120, a tee filter 122, a closed captioning (CC) filter 124, an electronic programming guide (EPG) filter 126, and a broadcast data filter 128. The VBI filters are proxies for underlying kernel level software drivers: CC driver 125, EPG driver 127, and BC data driver 129. Although three VBI filters are shown in FIG. 4 for discussion purposes, other VBI filters can be used in addition to, or in place of, the ones shown. A "line 21" decoder filter 131 is also provided in the filter graph 82.

Each filter has at least one input pin (represented by a box with a ">" sign inside on the left side of a filter) or at least one output pin (represented by a box with a ">" sign inside on the right side of a filter). Several filters have both an input pin and an output pin, and some filters have multiple input and/or output pins. Data flows from the tuner filter 110 through the various filters as indicated by the arrows connecting output pins of preceding filters to input pins of the next filters.

The drivers 84 provide an interface between the filters 82 and corresponding hardware components 64. The tuner filter 110 controls the tuning frequency of the tuner 102 via a tuner driver 130. The crossbar filter 112 submits routing instructions to the crossbar 104 via a crossbar driver 132. The audio filter 114 uses an audio driver 134 to control the audio decoder 106, and the video decoder filter 116 employs a video decoder driver 136 to manage the video decoder 108. The video renderer filter 120 provides display data to a display driver 138, which in turn provides pixel data to the display 68. A tee driver 123 is a kernel level instantiation of the tee filter 122. As noted above, the CC driver 125, EPG driver 127, and BC data driver 129 correspond to, and facilitate data flow for, the CC filter 124, the EPG filter 126, and BC data filter 128, respectively.

The worldwide tuning system 100 is configurable to different broadcast standards and broadcast frequencies based on ITU long-distance country codes. An ITU long-distance country code is the international calling code assigned by the International Telecommunications Union to facilitate international telephone calls. The ITU code is the number that precedes the area code in an international telephone call. The ITU code for the United States is "01" or just "1". The ITU codes uniquely identify the countries in the world.

The tuner filter 110 has an ITU country code table 140 that lists all of the participating countries or territories in the world according to their ITU codes. The tuner filter 110 also maintains multiple international channel-to-frequency mapping tables 142 that provide broadcast standards and correlate channels and broadcast frequencies in individual countries. There might be one channel-to-frequency table for each country, or it may be possible for two or more countries to share the same channel-to-frequency conversion. It is further noted that one country might have more than one table in the event that separate regions within the country require a different broadcast standard or different channel-to-frequency mappings.

The worldwide tuning system 100 exposes an application program interface 144 (discussed below and in the Appendix) that can be used during configuration to select the correct country. The API enables applications to set video standards, set TV channels, and to get or set information about the channel frequencies. A configuration application allows a user to enter the correct country by typing in or selecting a country name, or abbreviation, via a user interface. The configuration application can convert the user-entered country to a corresponding country code and then call an API function to pass in country code to the worldwide tuning system. Once the country code is input, the worldwide tuning system 100 automatically adjusts to the appropriate broadcast standards and group of broadcast frequencies for the country.

Figure 5:
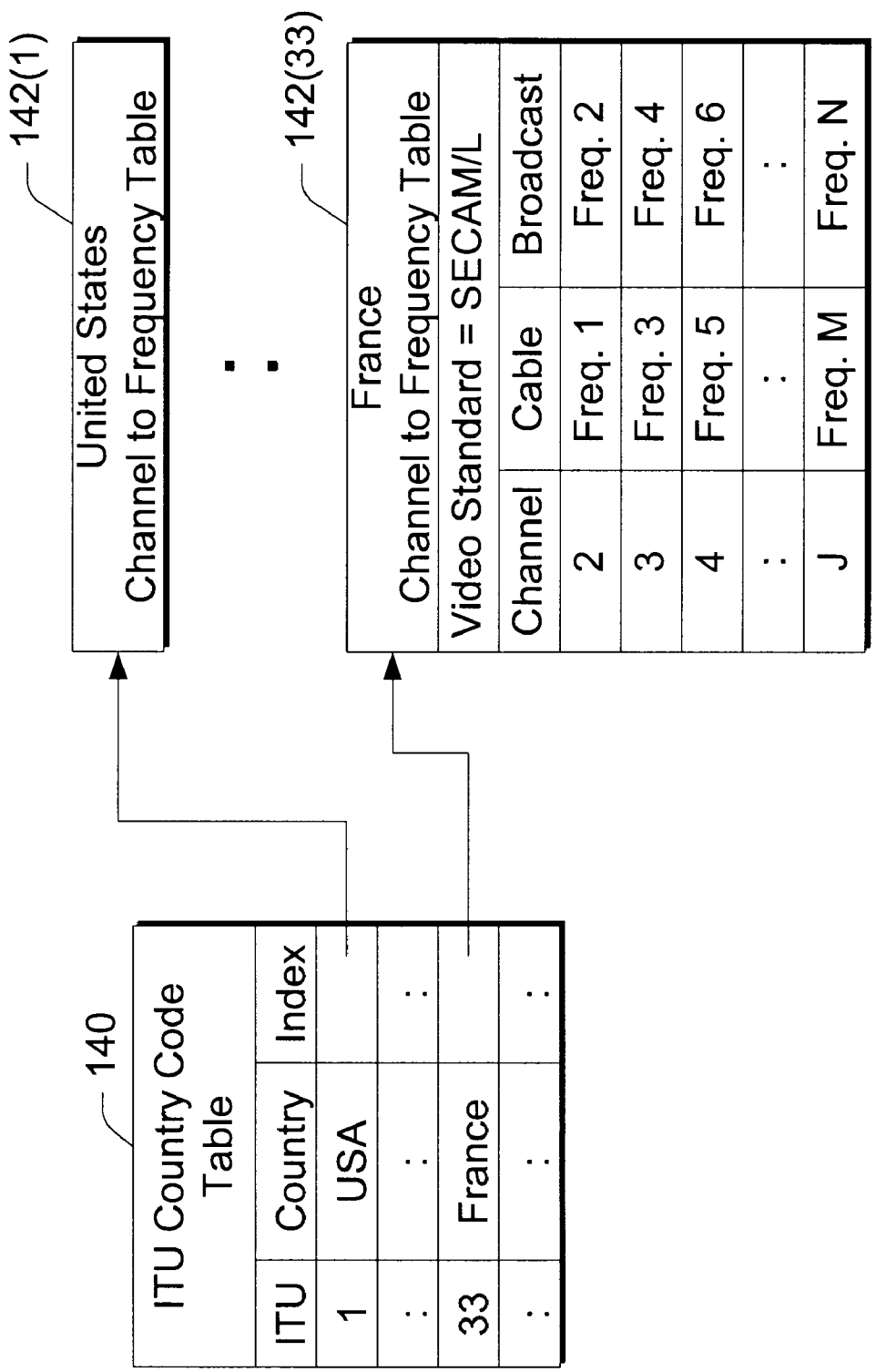
FIG. 5 is a diagrammatic illustration of a country code table and multiple channel-to-frequency mapping tables, and the indexing between the tables.

FIG. 5 shows the relationship between the country code table 140 and various channel-to-frequency tables 142. The country code table 140 lists the countries by their ITU long-distance codes. The country code table 140 also correlates broadcast standards with particular countries. In this illustration, the country code table 140 lists the United State, which has an ITU code of 1 and employs the NTSC standard, and France, which has an ITU code of 33 and utilizes the SECAM/L standard.

The ITU country code table 140 contains indexes to corresponding channel-to-frequency tables 142. In FIG. 5, the table entries for USA and France index to corresponding channel-to-frequency tables 142(1) and 142(33). The channel-to-frequency tables 142 in turn map channels in the countries to appropriate cable and broadcast frequencies for those countries. The channel-to-frequency tables 142 also contain the appropriate video standards for the countries. The France channel-to-frequency table 142(33), for example, correlates channel numbers 2, 3, 4, . . . , J with associated cable and broadcast frequencies, and identifies the SECAM/L standard.

Figure 6:
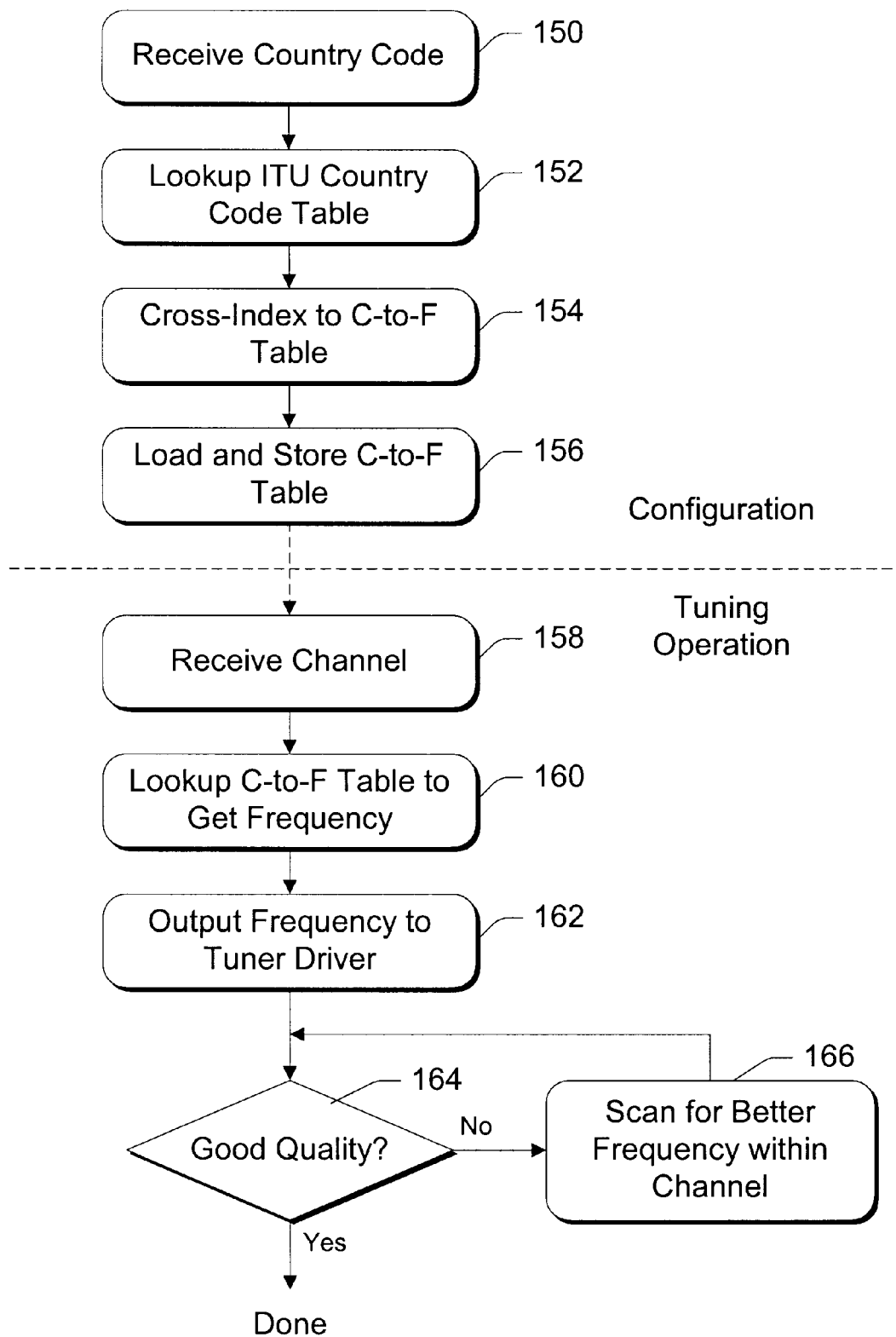
FIG. 6 is a flow diagram showing steps in a method for configuring the worldwide tuning system of FIG. 4.

FIG. 6 shows steps in a method for automatically configuring the worldwide tuning system 100 to a particular video standard and set of frequencies. At step 150, the tuner filter 110 receives a particular country or ITU country code via API 144. More specifically, an application uses the method "IAMTVTUNER::put_CountryCode" to select a country. The tuner filter 110 uses the country or ITU country code to perform a lookup operation in the country code table 140 (step 152 in FIG. 6). The referenced table entry is then used to index the appropriate channel-to-frequency table 142 (step 154). The tuner filter 110 loads and stores the indexed channel-to-frequency table 142 for subsequent tuning operations (step 156). A method "IAMTVTUNER::put_TuningSpace" sets the locale specific ID and a method "IAMTVTUNER::StoreAutoTune" saves all locale specific optimal tuning frequencies for later recall.

Locale specific tuning is an advantageous feature of this worldwide tuning system. It is particularly useful for portable situations. For instance, suppose a user is located in Seattle, Washington, USA. The user might configure the worldwide tuning system to the Seattle locale using "IAMTVTUNER:: put_TuningSpace". All channels in Seattle are scanned for optimal tuning frequencies and are then stored via "IAMTVTUNER::StoreAutoTune" as a file or other data record.

Now, suppose the user travels to Paris, France, taking along a portable viewer unit. The user can then reconfigure the worldwide tuning system to the Paris locale using "IAMTVTUNER::put_TuningSpace". All channels in Paris are scanned for optimal tuning frequencies and are then stored in a second file via "IAMTVTUNER::StoreAutoTune".

When the user returns to Seattle with the portable viewer unit, the worldwide tuning system can simply retrieve the file with optimal frequencies for that locale. The worldwide tuning system is immediately restored for operation in Seattle, without reconfiguration and rescanning. As a result, the portable viewer unit is immediately available for TV viewing in Seattle. Similarly, the user could return to Paris and retrieve the stored frequency file for that locale, as well.

Once a mapping table 142 for a particular country is loaded, the worldwide tuning system 100 tunes to particular frequencies upon selection of various channels. At step 158, the tuner filter 110 receives a particular channel via API 144. The method "IAMTVTUNER::put_Channel" is called to input the channel number. The tuner filter 110 uses the channel to lookup the corresponding frequency in the channel-to-frequency table 142 (step 160 in FIG. 6). The tuner filter 110 passes the frequency to the tuner driver 130, which tunes the hardware tuner 102 (step 162). The tuner driver 130 responds with information regarding the quality of the signal received at that frequency (step 164). If the quality is not optimal, the tuner filter 110 uses a search algorithm to scan for the best possible signal within the channel (step 166 in FIG. 6). The method "IAMTVTUNER::AutoTune" is called to scan for a precise signal on the channel's frequency.

Filter Graph Data Flow Architecture

With continuing reference to FIG. 4, the tuner filter 110 communicates tuning changes to the other filters synchronously while providing the control instructions to the underlying tuner driver 130 and tuner 102. At the beginning and end of each tuning operation, the tuner filter 110 sends a packet 170 downstream to all filters connected in the graph 82. The packet 170 contains information regarding the tuning operation in progress. The packet 170 includes the country code, the channel being tuned, the video standard, and flags indicating whether this is the beginning or end of the tuning operation. As an example, the packet 170 can be implemented as a data structure KS_TVTUNER_CHANGE_INFO, as follows:

```
typedef struct tagKS_TVTUNER_CHANGE_INFO {
    DWORD    dwFlags;                  //DS_TVTUN-
                                         ER_CHANGE_*
    DWORD    dwCountryCode;            //ITU Country Code
    DWORD    dwAnalogVideoStandard;    //Current Analog Video Standard
    DWORD    dwChannel;                //Channel Number
} KS_TVTUNER_CHANGE_INFO,
*PKS_TVTUNER_CHANGE_INFO;
dwFlags:
KS_TVTUNER_CHANGE_BEGIN_TUNE    Tuning operation
                                  is beginning
```

| | |
|---|---|
| -continued | |
| KS_TVTUNER_CHANGE_END_TUNE | Tuning operation is complete |

The crossbar filter 112 routes the packet to the video decoder filter 116 and audio filter 114. Even though the packet may not contain any audio instructions, the packet notifies the audio filter 114 when a tuning operation is beginning and ending. In response, the audio filter mutes the audio output between the time it receives a beginning packet and an ending packet to prevent output of noise or a distorted sound.

The video decoder filter 116 passes the packet 170 on to tee filter 122 and overlay mixer filter 118. The tee filter 122 replicates the packet and supplies it to the closed captioning filter 124, the EPG filter 126, and the broadcast data filter 128. These filters 124–128 detect whether the packet 170 is for beginning or ending a tuning operation. During the tuning transition, these filter 124–128 cease decoding the data because the data might become corrupted in the interim. The overlay mixer filter 118 passes the packet onto the video renderer filter 120.

The video decoder filter 116 extracts the video standard from the packet 170 to determine which standard is being used in the video data stream. This information, in turn, determines which VBI (vertical blanking interval) lines to decode. The video decoder filter 116 includes a VBI component 172 and a video capture component 174. Depending on the video standard, the VBI component 172 decodes certain lines of data contained in the digital video data output by the video decoder 108. This VBI data is passed to the tee filter 122, where it is sent for processing to the closed captioning filter 124, the EPG filter 126, and the broadcast data filter 128. The tee filter 122 does not replicate the data; rather, the data is treated as being read-only and a single copy is simultaneously passed to each of the VBI decoders.

The VBI data might include closed captioning information for the closed captioning filter 124, data used by the EPG filter 126 to create or update an electronic programming guide, or other data collected by the data filter 128 to provide stock quotes, whether, news, and so forth. As noted above, many other types of VBI codecs may be used to decode many different type of data embedded in the VBI portion of the television signal. The closed captioning filter 124 outputs data to a "line 21" decoder filter 131, which decodes the CC data. The decoder filter 131 passes the closed captioning data on to the overlay mixer filter 118, where it is combined with the video data.

The video capture component 174 decodes the digital video data from the video decoder 108 according to the video standard contained in the packet 170. Additionally, the video capture component 174 might further process or enhance the video data stream.

The video decoder filter 116 outputs the video data to the overlay mixer filter 118 where it is combined with the closed captioning data. The overlay mixer filter processes the video data and outputs the stream to the video renderer filter 120 for rendering. The video renderer filter 120 outputs the video data stream to the display driver 138, which drives the display 66.

Figure 7:
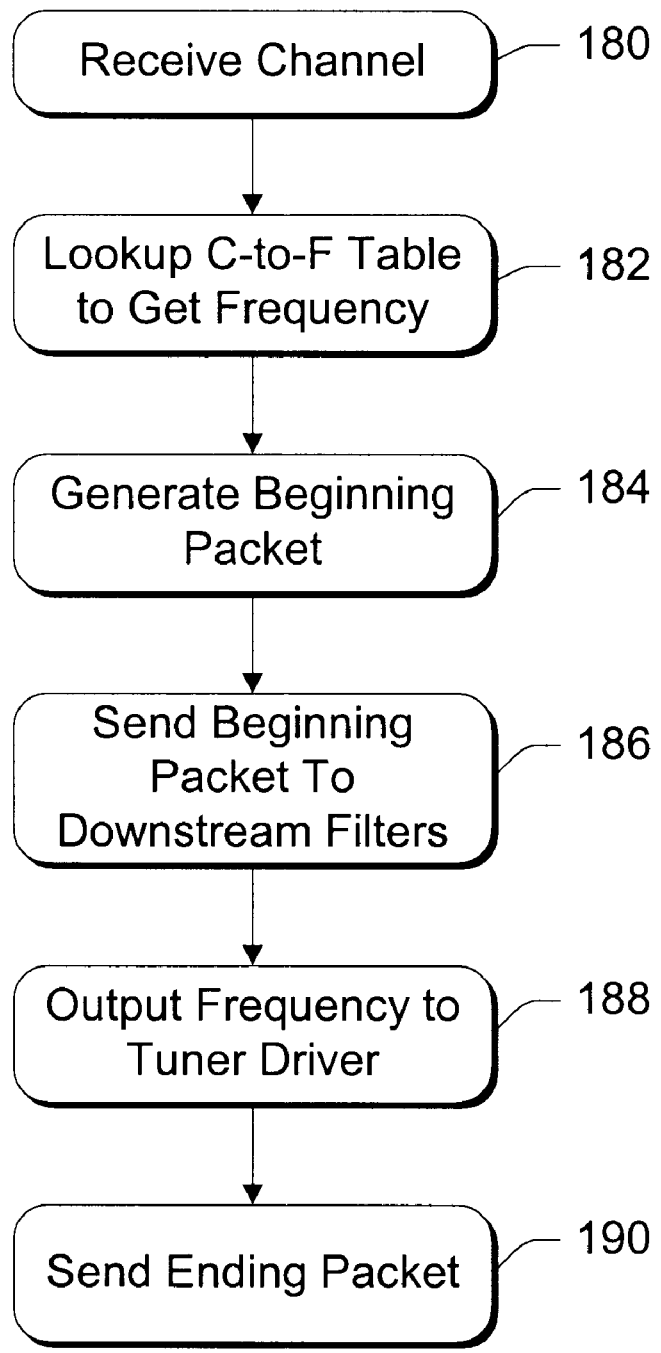
FIG. 7 is a flow diagram showing steps in a method for changing channels using the worldwide tuning system of FIG. 4.

To illustrate data flow through the worldwide tuning system 100, FIG. 7 shows steps in a method for changing channels. At step 180, the tuner filter 110 receives a new channel via API 144 (i.e., IAMTVTUNER::put_Channel).

The tuner filter 110 uses the channel to lookup a corresponding broadcast or cable frequency in the channel-to-frequency table 142 (step 182 in FIG. 7). The tuner filter 110 generates a beginning packet that contains the country code, the new channel, the video standard, and a flag indicating the start of the tuning operation (step 184). The tuner filter 110 passes the beginning packet to the downstream filters to inform them of the impending tuning operation (step 186). In response, some downstream filters (e.g., audio filter 114, closed captioning filter 124, EPG filter 126, data filter 128) cease processing the current data stream to avoid processing corrupt or incomplete data.

At step 188 in FIG. 7, the tuner filter 110 outputs the new frequency to the tuner driver 130, which tunes the tuner 102 to the new channel. Fine adjustment may then be performed as described above with respect to steps 164 and 166 in FIG. 6.

After the tuner 102 is tuned to the new channel, the tuner filter 110 generates an ending packet that contains the country code, the new channel, the video standard, and a flag indicating the end of the tuning operation (step 190). In response, the downstream filters begin processing the data stream.

Tuner API

The tuner filter 110 implements an API that enables applications to set video standards, set TV channels, and to get or set information about the channel frequencies. This interface can also determine what analog video standards your TV supports. Generally, the API includes methods for performing the following functions:

1. Retrieve pointers to supported interfaces
2. Increment reference count of tuner filter object
3. Decrement reference count of tuner filter object
4. Retrieve all analog video TV standards supported by the tuner
5. Retrieve the current analog video TV standard in use
6. Set the TV channel
7. Retrieve current TV channel
8. Retrieve the highest and lowest channels available
9. Scan for a precise signal on the channel's frequency
10. Set the country code to establish the frequency set
11. Retrieve the country code
12. Set a storage index for regional channel to frequency mappings
13. Retrieve the storage index for regional fine tuning
14. Retrieve the number of TV sources plugged into the tuner filter
15. Set the tuner input type (cable or antenna)
16. Retrieve the tuner input type (cable or antenna)
17. Set the hardware tuner input connection
18. Retrieve the hardware tuner input connection
19. Retrieve the current video frequency
20. Retrieve the current audio frequency A detailed list of the methods in the tuner API is provided in the Appendix to this disclosure. This Appendix is incorporated into the disclosure.

Upgrading Worldwide Tuner

Video standards employed within a country may change from time to time for various reasons. For instance, governments might reallocate broadcast frequencies or adopt a different video standard for political, administrative, or technical reasons, or countries may be created or cease to exist. Due to these changes, the channel-to-frequency mapping tables within the tuner filter 110 may output erroneous frequency values or erroneous video standards.

In one implementation, the filters 82 are configured as dynamic linked libraries (DLLs). Any one filter may be replaced dynamically without restarting the system. For instance, in the event that certain broadcast frequencies have changed, a manufacturer or other provider can provide a new tuner filter DLL with updated channel-to-frequency tables that reflect the new broadcast frequencies. This tuner filter DLL can replace the existing, out-of-date tuner filter.

The new filter DLLs may be downloaded using several different means. As examples, the filter DLLs might be downloaded over the Internet, or broadcast as VBI data, or distributed on disk.

The worldwide tuning system is advantageous over prior art tuning systems. The tuning system enables worldwide tuning based on ITU country code, allowing it to be configured in the field rather than at the factory. Additionally, if standards or channel frequencies change, the tuning system can be reconfigured.

Another benefit is that the worldwide tuning system is portable. The worldwide tuning system can be implemented in portable computers and reconfigured to receive different television broadcasts as the user travels to different countries.

Another benefit is that the worldwide tuning system can be implemented as replaceable DLLs that are accessed via a set of APIs. As changes are made to broadcast television standards and channel frequencies, new DLLs can be downloaded and used to replace out-of-date DLLs without affecting operation of the system.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A television tuning system comprising:
    tuner circuitry to tune to a particular television frequency that carries a television signal;
    video decoder circuitry coupled to receive the television signal from the tuner circuitry and to convert the television signal to digital data;
    a tuner software module to adjust the tuner circuitry to the particular television frequency;
    a video decoder software module to decode the digital data according to a particular video standard;
    a tuner driver to interface the tuner software module with the tuner circuitry; and
    a video driver to interface the video decoder software module with the video decoder circuitry.

2. A television tuning system as recited in claim 1, wherein the tuner software module is embodied as a dynamic linked library.

3. A television tuning system as recited in claim 1, wherein the video decoder software module has a VBI (vertical blanking interval) component to capture VBI data in the television signal and a video capture component to process video data in the television signal.

4. A television tuning system as recited in claim 3, further comprising one or more VBI decoding modules coupled to the video decoder software module to receive the VBI data and to decode various types of VBI data including closed captioning data and electronic programming guide data.

5. A television tuning system as recited in claim 2, comprising:
    tuner circuitry to tune to a particular television frequency that carries a television signal;
    video decoder circuitry coupled to receive the television signal from the tuner circuitry and to convert the television signal to digital data;
    a tuner software module to adjust the tuner circuitry to the particular television frequency;
    a video decoder software module to decode the digital data according to a particular video standard; and
    wherein the tuner software module generates and sends tuning packets to the video decoder software module.

6. A television tuning system as recited in claim 5, wherein individual tuning packets comprise a designation of country within which the tuning system is configured to receive television signals, a channel to be tuned, and the particular video standard.

7. A television tuning system comprising:
    tuner circuitry to tune to a particular television frequency that carries a television signal;
    video decoder circuitry coupled to receive the television signal from the tuner circuitry and to convert the television signal to digital data;
    a tuner software module to adjust the tuner circuitry to the particular television frequency;
    a video decoder software module to decode the digital data according to a particular video standard; and
    wherein the tuner software module and the video decoder software module are implemented as filter objects in a filter graph.

8. A television tuning system comprising:
    tuner circuitry to tune to a particular television frequency that carries a television signal;
    video decoder circuitry coupled to receive the television signal from the tuner circuitry and to convert the television signal to digital data;
    a tuner software module to adjust the tuner circuitry to the particular television frequency;
    a video decoder software module to decode the digital data according to a particular video standard; and
    wherein the tuner software module supports an application program interface to expose functionality of the tuner software module to an application program.

9. A television tuning system comprising:
    tuning/decoding circuitry to tune to a particular television channel frequency and decode a television signal carried on the channel frequency using a particular video standard; and
    a filter graph containing one or more interconnected filter objects that define television tuning and decoding functions, the filter objects specifying the particular channel frequency and the particular video standard for use by the tuning/decoding circuitry.

10. A television tuning system as recited in claim 9, wherein the filter graph comprises a tuner filter object to specify the particular television channel frequency used by the tuning/decoding circuitry.

11. A television tuning system as recited in claim 9, wherein the filter graph comprises a video decoder filter object to specify the particular video standard used by the tuning/decoding circuitry.

12. A television tuning system as recited in claim 9, wherein the filter graph comprises:

a tuner filter object to control to specify the particular television channel frequency used by the tuning/decoding circuitry;

a video decoder filter object to specify the particular video standard used by the tuning/decoding circuitry; and one or more VBI (vertical blanking interval) filter objects to process data from the decoded television signal.

13. A television tuning system comprising:

tuner circuitry to tune to a particular television frequency that carries a television signal;

video decoder circuitry coupled to receive the television signal from the tuner circuitry and to convert the television signal to digital data;

a tuner software module to select the particular television frequency and a particular video standard;

a video decoder software module to decode the digital data according to the particular video standard; and wherein when a new channel is requested, the tuner software module generates and sends a tuning packet to inform the video decoder software module of an impending change to the new channel, the tuner software module also instructing the tuner circuitry to tune to a new television frequency that corresponds the new channel.

14. A television tuning system as recited in claim 13, wherein the tuner software generates a beginning tuning packet prior to changing to the new channel and an ending tuning packet after changing to the new channel.

15. A television tuning system as recited in claim 13, wherein the tuning packet comprises a designation of country within which the tuning system is configured to receive television signals, a channel to be tuned, the particular video standard, and flags indicating whether the tuning packet represents a beginning of a tuning operation or an ending of the tuning operation.

16. A television tuning system as recited in claim 13, wherein further comprising:

a crossbar software module;

a tee software module;

an audio decoder software module;

one or more VBI (vertical blanking interval) software modules to process VBI data in the digital video data; and the tuner software module routes the tuning packet to the crossbar software module, the crossbar software module routes the tuning packet to the video decoder software module and the audio decoder software module, the video decoder software module routes the tuning packet to the tee software module, and the tee software module routes the tuning packet to the VBI software modules.

17. A television tuning system comprising:

(A) hardware circuitry to receive and process a television signal, the hardware circuitry comprising:

tuner circuitry to tune to a particular television frequency that carries an analog television signal, the tuner circuitry separating the television signal into an analog video signal and an analog audio signal;

video decoder circuitry coupled to receive the analog video signal from the tuner circuitry and to convert the analog video signal to digital video data;

audio decoder circuitry coupled to receive the analog audio signal from the tuner circuitry and to convert the analog audio signal to digital audio data;

(B) a software layer to control the hardware circuitry, the software layer comprising:

a tuner module to adjust the tuner circuitry to the particular television frequency;

a video decoder module to decode the digital video data according to a particular video standard; and an audio module to control the audio decoder circuitry; and (C) a driver interface layer to interface the software layer and the hardware circuitry, the driver interface layer comprising:

a tuner driver to interface the tuner module with the tuner circuitry;

a video driver to interface the video decoder module with the video decoder circuitry; and an audio driver to interface the audio module with the audio decoder circuitry.

18. A television tuning system as recited in claim 17, wherein the software layer exchanges control information synchronously while the hardware circuitry receives and processes the television signal.

19. A television tuning system as recited in claim 17, wherein the tuner module generates a tuning packet containing tuning instructions for each tuning change, and sends the tuning packet to the video decoder module and the audio module.

20. A television tuning system as recited in claim 19, wherein the tuning packet contains the particular video standard that the video decoder module uses to decode the digital video data.

21. A television tuning system as recited in claim 17, wherein the tuner module generates and sends a beginning tuning packet to the video decoder module and the audio module at a beginning of a tuning operation and subsequently generates and sends an ending tuning packet to the video decoder module and the audio module at an end of a tuning operation.

22. A television tuning system as recited in claim 21, wherein the audio module turns off the audio decoder circuitry in an interim between receiving the beginning and ending tuning packets.

23. A television tuning system as recited in claim 17, wherein the software layer further comprises one or more VBI (vertical blanking interval) modules to process VBI data in the digital video data.

24. A television tuning system as recited in claim 23, wherein the tuner module generates and sends a beginning tuning packet to the VBI modules at a beginning of a tuning operation and subsequently generates and sends an ending tuning packet to the VBI modules at an end of a tuning operation, and the VBI modules cease processing the VBI data in an interim between receiving the beginning and ending tuning packets.

25. A television tuning system as recited in claim 17, wherein the software layer further comprises:

a crossbar;

a tee;

one or more VBI (vertical blanking interval) modules to process VBI data in the digital video data; and the tuner module generates a tuning packet containing tuning instructions for each tuning change, and routes the tuning packet to the crossbar, the crossbar routes the tuning packet to the video decoder and the audio decoder, the video decoder routes the tuning packet to the tee, the tee routes the tuning packet to the VBI modules.

26. A television tuning system as recited in claim 25, wherein an additional VBI module is added to the software layer and the tee automatically routes the tuning packet to the additional VBI module.

27. In a tuning system having multiple software modules, a tuning packet data structure embodied on a computer-readable media to share tuning-related data among the software modules, comprising:

a country code field to hold a country code for a country within which the tuning system is configured to receive television signals;

a channel field to hold a reference to a channel to be tuned;

a video standard field to hold a video standard that is used to decode a television signal for the country identified by country code in the country code field; and a flags field to differentiate between a beginning tuning operation and an ending tuning operation.

28. In a television tuning system having tuner circuitry to tune to a particular television frequency that carries a television signal and video decoder circuitry coupled to receive the television signal from the tuner circuitry and to convert the television signal to digital data, wherein the television tuning system also has a tuner software module to adjust the tuner circuitry to the particular television frequency and a video decoder software module to decode the digital data according to a particular video standard, a method comprising the following steps:

receiving a channel at the tuner software module;

to determining a frequency that corresponds to the channel;

generating a tuning packet at the tuner software module, the tuning packet containing the channel and a television standard;

passing the tuning packet to the video decoder software module;

sending the frequency to the tuner circuitry;

tuning to the frequency to receive a television signal carried by the channel;

converting the television signal to digital video data; and decoding the digital video data at the video decoder software module using the television standard received in the tuning packet.

29. A method as recited in claim 28, further comprising the step of scanning for a better quality frequency within the channel.

30. A method as recited in claim 28, wherein the generating and passing steps are performed prior to the tuning step, and further comprising the steps of generating a second tuning packet at the tuner software module and passing the second tuning packet to the video decoder software module after the tuning step.

31. A method as recited in claim 28, wherein the determining steps comprises looking up the frequency in a lookup table that correlates the channel with the frequency.

32. A method as recited in claim 28, wherein the television tuning system has a software layer comprising the tuner software module, a crossbar software module, an audio software module, the video decoder software module, a tee software module, and one or more VBI (vertical blanking interval) software modules, and wherein the passing step comprises the following steps:

routing the tuning packet to the crossbar software module;

routing the tuning packet from the crossbar software module to the video decoder software module and the audio decoder software module;

routing the tuning packet from the video decoder software module to the tee software module; and routing the tuning packet from the tee software module to the VBI software modules.

33. A computer-readable medium having computer-executable instructions for performing the steps in the method as recited in claim 28.

34. A television tuning system comprising:

hardware circuitry that receives and processes a television signal, the hardware circuitry comprising tuner circuitry, video decoder circuitry, and audio decoder circuitry;

a software layer that controls the hardware circuitry, wherein the software layer comprises a tuner module configured to adjust the tuner circuitry, a video decoder module configured to control the video decoder circuitry, and an audio decoder module configured to control the audio decoder circuitry; and a driver interface layer that interfaces the software layer and the hardware circuitry.

35. A television tuning system as recited in claim 34, wherein the software layer exchanges control information synchronously while the hardware circuitry receives and processes the television signal.

36. A television tuning system as recited in claim 34, wherein the tuner module is configured to generate a tuning packet that contains tuning instructions and to send the tuning packet to the video decoder module and the audio decoder module.

37. A television tuning system as recited in claim 34, wherein the tuner module is configured to send data packets to the video decoder module and the audio decoder module at a beginning and an ending of a tuning operation.

38. A television tuning system as recited in claim 34, wherein the software layer further comprises:

a crossbar;

a tee;

one or more VBI (vertical blanking interval) modules to process VBI data in the digital video data; and the tuner module generates a tuning packet containing tuning instructions for each tuning change, and routes the tuning packet to the crossbar, the crossbar routes the tuning packet to the video decoder and the audio decoder, the video decoder routes the tuning packet to the tee, the tee routes the tuning packet to the VBI modules.

39. A television tuning system as recited in claim 38, wherein an additional VBI module is added to the software layer and the tee automatically routes the tuning packet to the additional VBI module.

40. A television tuning system as recited in claim 34, wherein the software layer comprises a VBI (vertical blanking interval) module configured to process VBI data.

* * * * *